(12) United States Patent
Davis et al.

(10) Patent No.: US 6,246,533 B1
(45) Date of Patent: Jun. 12, 2001

(54) PROGRAMMABLE WRITE DRIVER CIRCUIT FOR WRITING INFORMATION TO A MAGNETIC STORAGE MEDIA

(75) Inventors: Bradley K. Davis; Robert M. Thelen, both of Ft. Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/114,392

(22) Filed: Jul. 13, 1998

(51) Int. Cl.[7] .................................................. G11B 5/02
(52) U.S. Cl. .............................................. 360/68; 360/46
(58) Field of Search .................... 360/66, 46, 68

(56) References Cited

U.S. PATENT DOCUMENTS

| | | | |
|---|---|---|---|
| 5,282,094 | 1/1994 | Ngo ........................................ | 360/46 |
| 5,287,231 | 2/1994 | Shier et al. ............................ | 360/68 |
| 5,291,347 | 3/1994 | Ngo et al. ............................. | 360/68 |
| 5,296,975 | * 3/1994 | Contreras et al. .................... | 360/46 |
| 5,638,012 | 6/1997 | Hashimoto et al. ................. | 327/110 |
| 5,751,171 | 5/1998 | Ngo ..................................... | 327/110 |
| 5,852,526 | * 12/1998 | Huntington ........................... | 360/66 |

FOREIGN PATENT DOCUMENTS

| | | | |
|---|---|---|---|
| WO95/35563 | 12/1995 | (WO) ............... | G11B/5/02 |
| WO99/16056 | 4/1999 | (WO) ............... | G11B/5/09 |

* cited by examiner

Primary Examiner—Regina Y. Neal

(57) ABSTRACT

The present invention provides a write driver circuit for use in a magnetic read/write system for writing information to a magnetic storage medium. In accordance with a first embodiment of the present invention, the write driver circuit comprises a variable common mode circuit component for enabling the common mode output voltage of the write driver circuit to be varied and/or set to a preselected value. In accordance with a second embodiment of the present invention, the write driver circuit comprises a variable damping resistance circuit component for enabling the damping resistance of the write driver circuit to be varied and/or set to a preselected value in order to optimize write current rise time and overshoot. The write driver circuit may comprise both the variable common mode circuit component and the variable damping resistance component to enable both the common mode output voltage and the damping resistance to be varied and set to preselected values in order to optimize the performance of the write driver circuit. In accordance with another embodiment of the present invention, a relatively high-power write driver circuit is fabricated using a fabrication process normally used for fabricating relatively low-power write driver circuits. in accordance with this embodiment, the current sources of the write driver circuit are each comprised of a plurality of transistors connected in series in cascode configurations such that the voltage drop across any one of the transistors of the cascode configurations is limited to meet the requirements. of the fabrication process.

23 Claims, 5 Drawing Sheets

PROGRAMMABLE WRITE DRIVER CIRCUIT FOR WRITING INFORMATION TO A MAGNETIC STORAGE MEDIA

TECHNICAL FIELD OF THE INVENTION

The present invention relates to a programmable write driver circuit and, more particularly, to a programmable write driver circuit that can be incorporated into a magnetic read/write system for causing a write head to write information to a magnetic storage media.

BACKGROUND OF THE INVENTION

Magnetic read/write systems such as, for example, tape and disk drives, store digital information on a magnetic storage media by writing magnetic bit patterns to the storage media. The storage media is a ferromagnetic material and the data is stored via magnetic dipoles. A binary one is represented as a change in magnetization within a bit window of the storage media, while a binary zero is represented as no magnetization change within the bit window of the storage media.

Magnetic dipoles are created on the media by altering the magnetic field, or B-Field, established by the write head under control of the write driver circuit. The write head comprises an inductive coil which is wrapped around a conductive head yoke. The write driver circuit is coupled to the write head via the inductive coil. Changes in write current polarity generated by the write driver circuit establish an altering B-field in the inductive coil and in the head yoke. The yoke is comprised of a very magnetically malleable material and readily conducts the induced B-field. The yoke generally is horse-shoe shaped and has opened ends which form a throat at the interface of the yoke and the magnetic media. Because the yoke is open at the media interface, a flinge B-field intercepts the ferromagnetic media and magnetic dipoles are written.

The minimum field strength necessary to flip the magnetic dipoles is commonly referred to as the coercivity field or coercivity bubble. The shape of the bubble determines many properties associated with the written data, such as jitter, density, and signal-to-noise ratio (SNR). Both the write head and the write driver circuit influence the coercivity bubble, and thus, the size and response of the B-field. The optimal coercivity bubble places a vertical field through the entire thickness of the storage media. A smaller bubble may not place a vertical field through the entire thickness of the storage media and, therefore, may not completely magnetize all domains of the storage media. A large bubble increases the data PW50, which is the time between the 50% points on an isolated pulse, and decreases data density. If the bubble is excessively large, data in adjacent tracks could be erased. The size of the bubble is determined by the magnitude of the write current, which is proportional to the B-field. During manufacturing, the head throat height typically is not well controlled and, therefore, utilizing a programmable write current improves head yield. In most magnetic disk and tape drive systems, the write current is programmable via a current analog-to-digital converter (IDAC). This allows the coercivity bubble to be optimized for each write head by varying the magnitude of the write current.

In order to create sharp media transitions, the write current rise time should be less than the media rise time. The optimal write current transition is slightly under damped in order to create optimal media transitions. This type of write current waveform provides the best rise time without creating excessive write current overshoot. Extreme overshoot may erase adjacent data. A write current rise time greater than the media rise time creates jagged domain transitions, which increase data jitter. To control the current overshoot, a damping resistor typically is placed across the write head coil. The amount of overshoot can be controlled by appropriately selecting the value of this damping resistor.

The write current rise time is a function of the write head inductance, the write current, and the supply voltage of the write driver circuit. The rise time can be defined as Trise=K*Iwr*Ind/VDD where K is a parameter based on process and circuit topology, Iwr is the write current, Ind is the head inductance, and VDD is the supply voltage. The designer of the write driver circuit has some freedom in selecting the design topology and the supply voltage. Media properties dictate the head inductance, Ind, and the write current, Iwr. As seen from the above equation, the write current rise time decreases as the supply voltage of the write driver circuit increases.

Storage density capability of magnetic storage media available on the market has increased greatly over the past several years. In order to take advantage of this increase in storage capacity, the number of write driver circuits integrated in a single read/write system needs to be increased in order to increase the number of write channels that can be utilized by the read/write system. However, in order to increase the number of write driver circuits without exceeding the power consumption requirements of the read/write system, low-power write driver circuits are required. As stated above, low-power write driver circuits (i.e., write driver circuits having relatively low supply voltages) have higher write current rise times than that associated with high-power write driver circuits.

It would be advantageous to be able to optimize the write current rise time for the particular write head being used, especially where the write driver circuit has a low supply voltage (e.g., 3.3-volts), in order to improve overall performance of the write driver circuit without having to increase the supply voltage of the write driver circuit. Currently, write driver circuits do not allow the damping resistance to be programmably varied in order to determine the damping resistance that results in the best write current rise time. Accordingly, a need exists for a method and apparatus for programmably setting and adjusting the damping resistance to optimize the write current rise time for the particular write head being used.

SUMMARY OF THE INVENTION

The present invention provides a write driver circuit for use in a magnetic read/write system for writing information to a magnetic storage medium. In accordance with a first embodiment of the present invention, the write driver circuit comprises a variable common mode circuit component for enabling the common mode output voltage of the write driver circuit to be varied and set to a preselected value. Preferably, the variable common mode circuit component comprises a plurality of transistors electrically coupled in parallel with each other via switching logic. The transistors of the common mode circuit component operate in the triode region such that they function as resistors. The transistors may be turned on and off by the switching logic to vary the resistance of the common mode circuit component to thereby vary the common mode output voltage of the write driver circuit. Preferably, the variable common mode circuit component is programmable to enable the resistance of the common mode circuit component to be programmably varied.

In accordance with a second embodiment of the present invention, the write driver circuit comprises a variable damping resistance circuit component for enabling the damping resistance of the write driver circuit to be varied and set to a preselected value in order to optimize write current rise time and overshoot. Preferably, the variable damping resistance circuit component comprises a plurality of transistors that are coupled in parallel to each other via switching logic. The damping resistance can be varied by switching the transistors of the variable damping resistance circuit on and off to thereby vary the write current rise time and overshoot. Preferably, the variable damping resistance circuit component is programmable to enable the damping resistance to be programmably varied.

In accordance with a third embodiment of the present invention, the write driver circuit comprises both the variable common mode circuit component and the variable damping resistance component for allowing both the common mode output voltage and the damping resistance to be varied and set to preselected values in order to optimize the performance of the write driver circuit.

In accordance with a fourth embodiment of the present invention, a relatively high-power write driver circuit is fabricated using a fabrication process normally used for fabricating relatively low-power write driver circuits. In accordance with this embodiment, the current sources of the write driver circuit are each comprised of a plurality of transistors connected in series in cascode configurations such that the voltage drop across any one of the transistors of the cascode configurations is limited to meet the requirements of the fabrication process. Preferably, a 3.3-volt MOS process is used to fabricate a write driver circuit having current sources that are driven by a 5-volt supply source. This allows faster write current rise times to be achieved while also allowing a 5-volt write driver circuit to be integrated with other components of the magnetic read/write system that utilize a 3.3-volt supply.

Other features and advantages of the present invention will become apparent from the following discussion, drawings and claims.

DETAILED DESCRIPTION OF THE INVENTION

Figure 1:
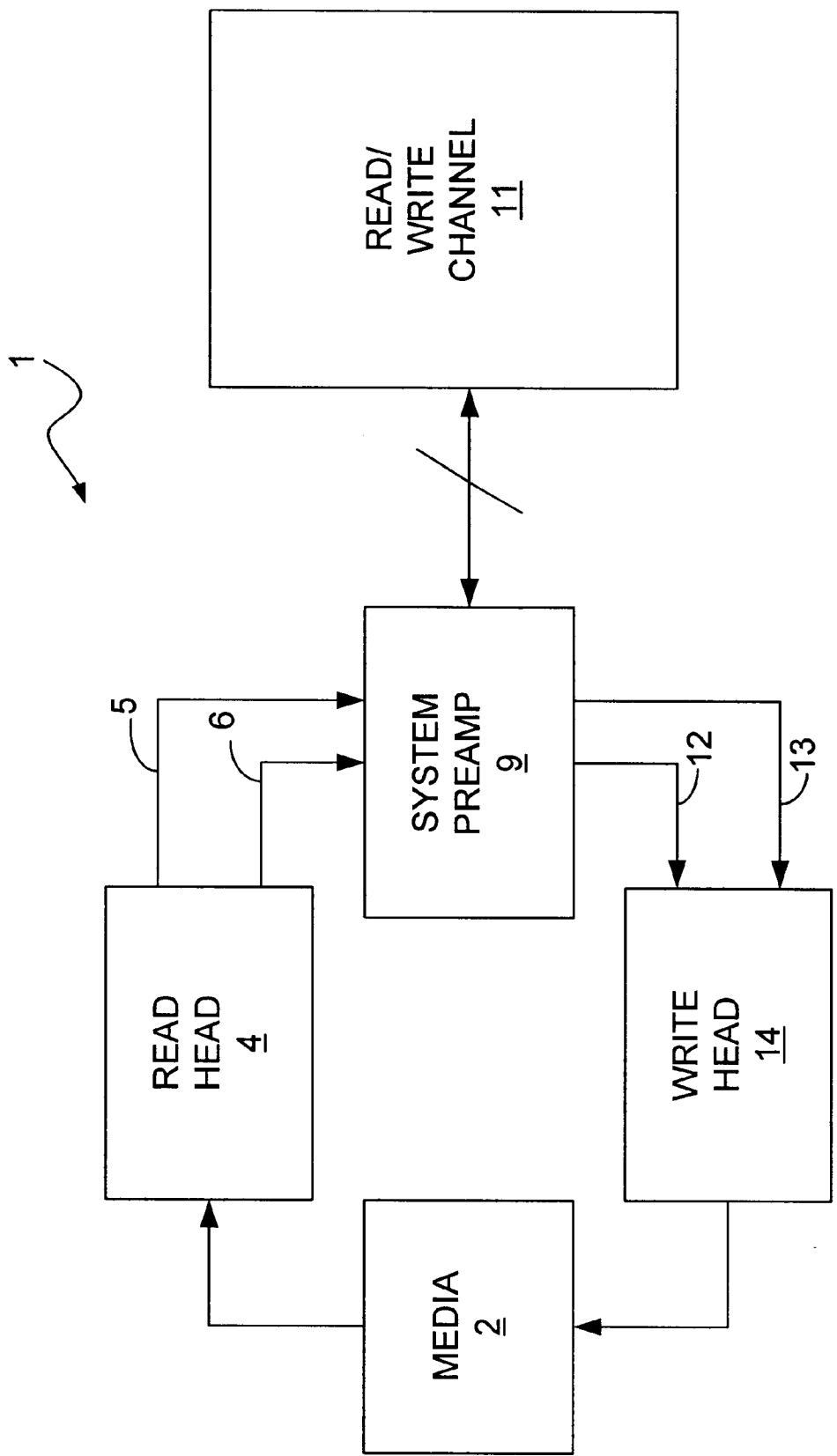
FIG. 1 is a block diagram illustrating a typical magnetic read/write system for reading information from and writing information to a magnetic storage media, such as, for example, a magnetic disk or tape.

FIG. 1 is a block diagram illustrating a typical magnetic read/write system 1 for reading information from and writing information to a magnetic storage media 2, such as, for example, a magnetic disk or tape. The present invention relates to such a system and, in particular, to a write driver circuit that can be incorporated into such a system. A typical magnetic read/write system 1 comprises a read head 4 for reading magnetic information stored on magnetic storage media 2. The read head 4 typically comprises a magneto resistor (MR) element (not shown) which generates a read signal current which is output on leads 5 and 6 to preamplifier 9. The head read system preamplifier 9 amplifies the read signal current output on leads 5 and 6 and processes the read signal current into information that is suitable for transmission over the read/write channel 11. The read/write channel 11 then transmits this information to processing circuitry (not shown), which may include, for example, an analog-to-digital converter and a microprocessor.

When information is being written to the storage media 2, information to be written is received by a write driver circuit (not shown) comprised in the preamplifier 9 from the read/write channel 11 in the form of encoded data which causes the preamplifier 9, via leads 12 and 13, to generate a current which excites an inductive element comprised by the write head 14. The inductive element of the write head 14 creates magnetic fields which change the magnetization of the magnetic storage media 2, as previously discussed.

Figure 2:
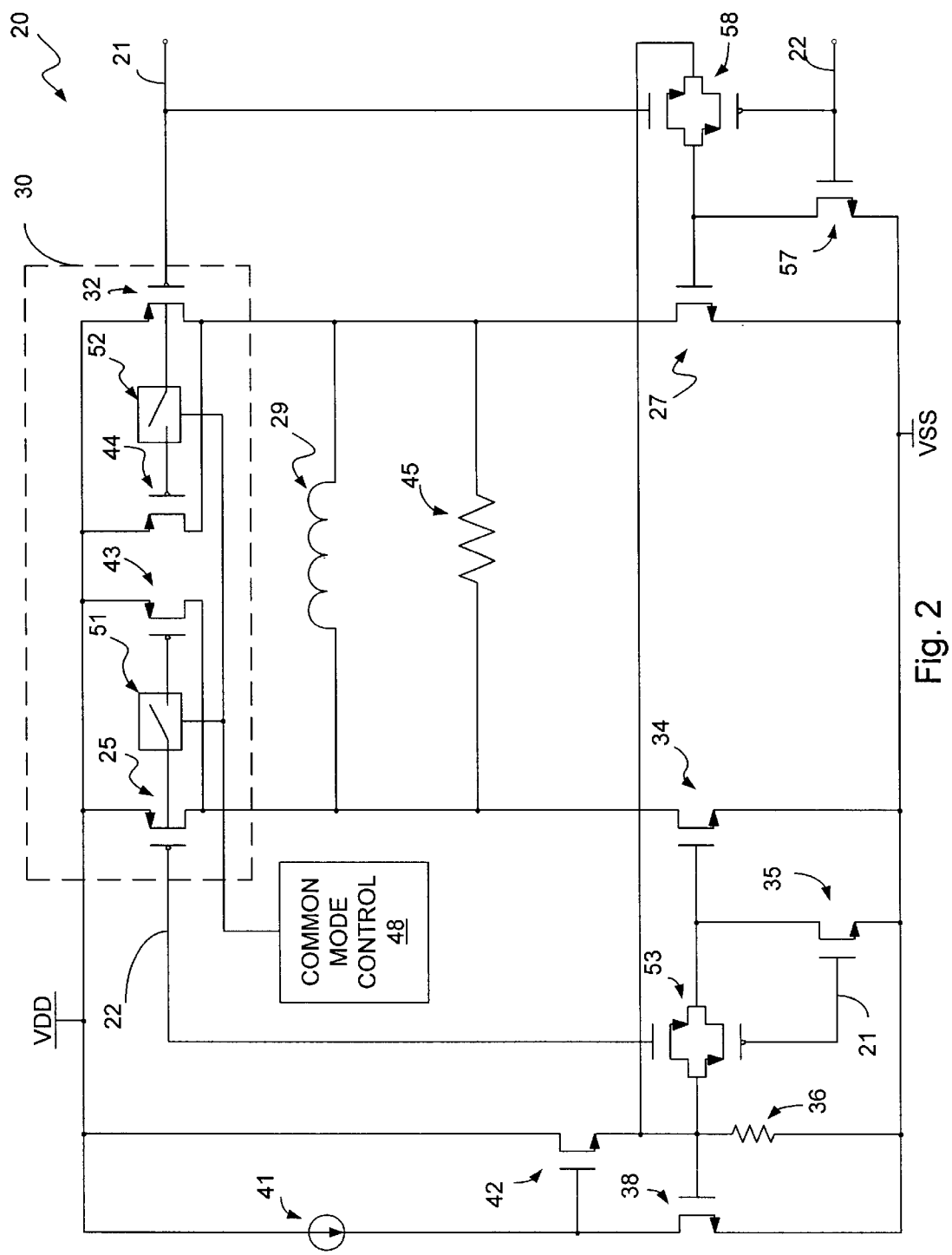
FIG. 2 is a schematic block diagram of the write driver circuit of the present invention in accordance with a first embodiment wherein the write driver circuit comprises a variable common mode circuit component for allowing the common mode output voltage of the write driver circuit to be programmably set and/or adjusted in order to optimize performance of the write driver circuit.

FIG. 2 is a schematic block diagram of the write driver circuit 20 of the present invention in accordance with a first embodiment wherein the write driver circuit 20 comprises a variable common mode circuit component 30 for allowing the common mode output voltage of the write driver circuit 20 to be programmably set and/or adjusted in order to optimize performance of the write driver circuit 20. The write driver circuit 20 preferably is implemented as an integrated circuit utilizing a 3.3 volt fabrication process known as AMOS 14, which was developed by Hewlett-Packard and which is well known by those skilled in the art. Therefore, the transistors implemented in the write driver circuit 20 are MOS transistors. However, it will be understood by those skilled in the art that the present invention is not limited with respect to the process utilized to fabricate the write driver circuit 20. It will also be understood by those skilled in the art that the transistors utilized by the write driver circuit 1 may be other types of transistors, such as, for example, bipolar junction transistors (BJr).

In accordance with this embodiment, the write driver circuit 20 is a 3.3-volt write driver circuit and, therefore, is a relatively low-power write driver circuit, as will be understood by those skilled in the art. In order to write information to the magnetic storage medium (not shown), the polarity of the write current is switched using inputs 21 and 22. When input 21 is high and input 22 is low, the P-channel metal oxide semiconductor (PMOS) transistor 25 and the N-channel metal oxide semiconductor (NMOS) transistor 27 are activated, thereby generating a positive write current through the write head inductive component 29.

Similarly, when input 21 is low and input 22 is high, PMOS transistor 32 and NMOS transistor 34 are activated, thereby causing the polarity of the write current passing through the write head inductive component 29 to be reversed. Transistors 27 and 34 function as current sources. Components 35, 53, 57 and 58 turn the current sources off and on.

NMOS transistors 34 and 38, in conjunction with resistor 36, form a high speed current mirror. As a result of the low input impedance of transistor 34, the current mirror settles quickly after the write current is switched. Resistor 36 and transistor 42 form a feedback circuit that generates a low-impedance reference for the current mirror. Implementation of the high-speed current mirror allows the current digital-to-analog converter (IDAC) 41 to operate at low current levels, thereby decreasing on-chip power dissipation. The current magnitude is set by the IDAC 41. The current mirror simply gains and buffers this IDAC 41 current to the write head inductive component 29. The IDAC 41 preferably is a five-bit IDAC. The IDAC 41 is used to adjust the output write current and to tune the coercivity bubble to the write head inductive component 29.

In accordance with this embodiment, a damping resistor 45 is selected to optimize the write current rise time. In order to create sharp media transitions, the write current rise time should be less than the media rise time. As stated above, the optimal write current transition is slightly under damped. This under-damped waveform provides the best rise time without creating excessive overshoot. Extreme overshoot may result in adjacent data being erased. A write current rise time greater than the media rise time creates jagged domain transitions, which increase data jitter. To control the current overshoot, the value of the damping resistor 45 is appropriately selected, as will be understood by those skilled in the art. Since write driver circuits currently available on the market utilize a damping resistor for this purpose, persons skilled in the art will understand the manner in which an appropriate value for the damping resistor is chosen. Therefore, the manner in which this is accomplished will not be further discussed herein in the interest of brevity.

A common mode circuit component 30 of the write driver circuit 20 allows the common mode output voltage to be programmably set and adjusted. Transistors 25 and 32 operate in the triode region and establish the common mode output voltage of the write driver circuit 20. In accordance with this feature of the present invention, the common mode circuit component 30 may be varied by adding transistors 43 and 44 in parallel with transistors 25 and 32, respectively, to thereby increase the resistance of the common mode circuit component 30. The common mode output voltage may then be programmably set and adjusted by activating or deactivating transistors 43 and/or 44 by selectively biasing the gates of transistors 43 and/or 44.

The ability to selectively bias the gates of transistors 43 and 44 is functionally represented in FIG. 2 by switches 51 and 52, which are activated and deactivated by a common mode control circuit 48. Additional transistors (not shown) may be added in parallel with transistors 43 and 44 and programmably set and/or adjusted by the common mode control circuit 48 to increase the overall resistance of the common mode circuit component 30.

It will be understood by those skilled in the art that the common mode circuit component 30 can be designed and/or implemented in a variety of ways in order to programmably set and/or adjust the overall resistance of the common mode circuit component 30. For example, rather than using transistors operating in the triode region in order to provide a particular resistance, resistors can be used and switches can be provided for shunting the current through or away from the resistors to thereby create a particular parallel arrangement of resistors. Those skilled in the art will understand the ways in which this can be accomplished and that a variety of elements can be implemented as the switches (e.g., diodes, transistors, etc.) in such an arrangement.

The common mode control circuit 48 may be implemented in any type of logic, such as, for example, simple decoder logic, and preferably is designed to be programmable to allow a user or designer to selectively control the value of the common mode output voltage in order to optimize the operation of the write driver circuit 20. The manner in which this may be accomplished will be understood by those skilled in the art since the task of designing a suitable common mode control circuit for accomplishing this task is relatively simple. Also, the common mode control circuit 48 may be internal or external to the write driver circuit 20.

Figure 3:
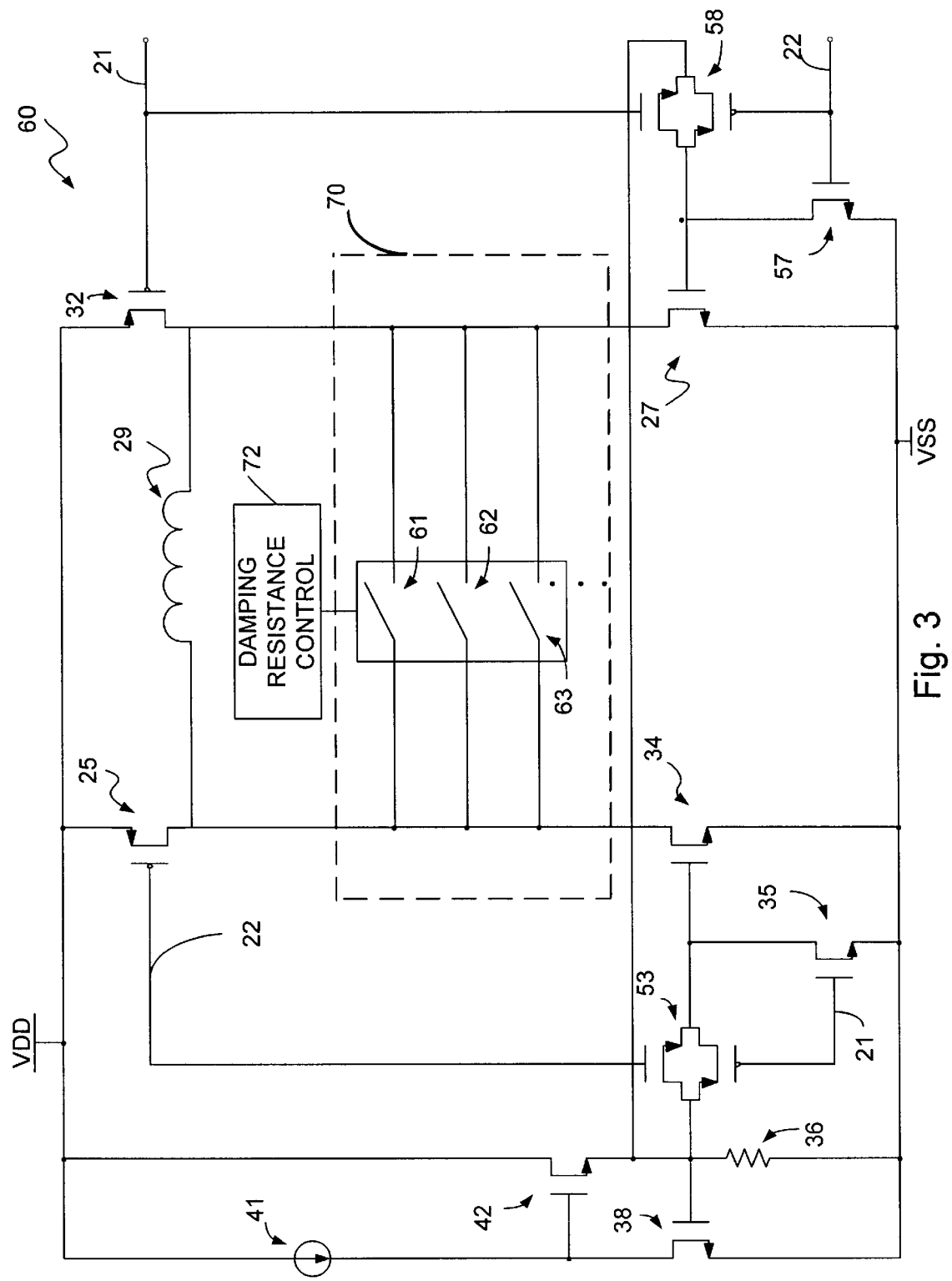
FIG. 3 is a schematic block diagram of the write driver circuit of the present invention in accordance with a third embodiment wherein write current damping may be programmably set and/or adjusted by selectively activating and deactivating damping resistors of a programmable damping resistance circuit component.

FIG. 3 is a schematic block diagram of the write driver circuit 60 of the present invention in accordance with an alternative embodiment wherein write current damping may be programmably set and/or adjusted by selectively activating and deactivating damping resistors of a programmable damping resistance circuit component 70. It should be noted that the operation of the write driver circuit 60, with respect to the elements that have reference numerals that are common to elements in both FIGS. 2 and 3, is identical to the operation of the write driver circuit 20 shown in FIG. 1. Therefore, in the interest of brevity, a detailed discussion of the operation of the write driver circuit 60 with respect to those common elements will not be provided.

The damping resistors are functionally represented in FIG. 3 as switches 61, 62 and 63. These switches 61, 62 and 63 preferably are implemented as transistors which operate in the triode region. The switches 61, 62 and 63 resistively shunt the coil of the write head inductive component 29. In order to decrease the write current overshoot, additional resistors are placed in parallel by turning more of the switches 61, 62 and/or 63 on using a damping resistance control circuit 72. Therefore, the write current rise time and overshoot can be varied until the optimum write current characteristics have been obtained. The damping resistance control circuit 72 may be implemented in any type of logic, such as, for example, simple decoder logic, and preferably is designed to be programmable to allow a user or designer to selectively vary the write current rise time. Also, the damping resistance control circuit may be internal or external to the write driver circuit 60.

Figure 4:
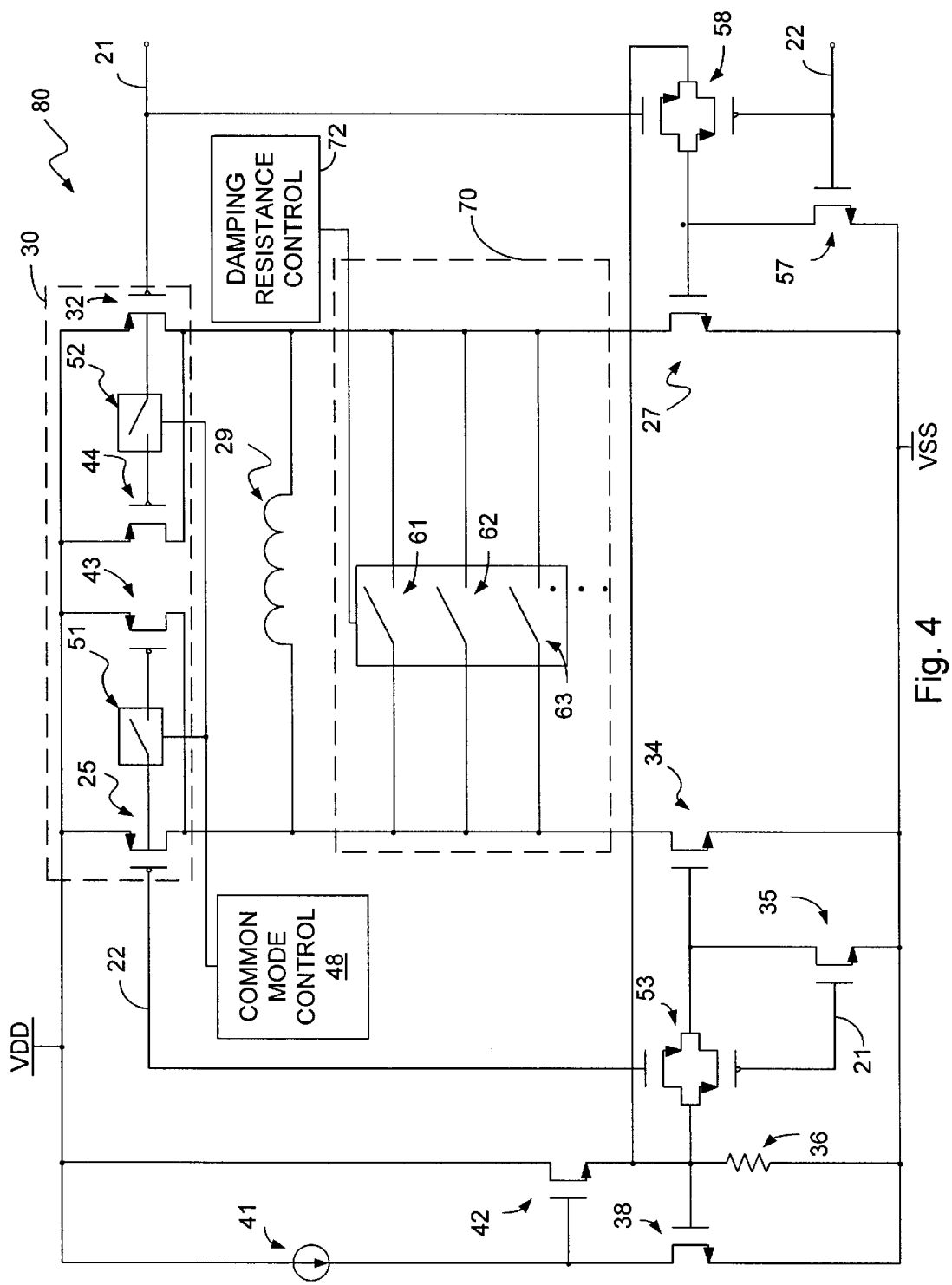
FIG. 4 is a schematic block diagram of the write driver circuit of the present invention in accordance with an alternative embodiment wherein the write driver circuit comprises the common mode circuit component of FIG. 2 as well as the damping resistance circuit component of FIG. 3.

FIG. 4 is a schematic block diagram of the write driver circuit 80 of the present invention in accordance with an alternative embodiment wherein the write driver circuit 80 comprises the common mode circuit component 30 of FIG. 2 as well as the damping resistance circuit component 70 of FIG. 3. Thus, the write driver circuit 80 of FIG. 4 provides programmability and adjustability with respect to both the common mode output voltage and the write current rise time and overshoot. As stated above, both the common mode control circuit 48 and the damping resistance control circuit 72 can be either internal to or external to the write driver circuit 80. Furthermore, the programmability and adjustability logic for the common mode control circuit 48 and for the damping resistance control circuit 72 may be combined in a single control circuit (not shown). The manner in which such a control circuit may be designed to accommodate all of these tasks will be understood by those skilled in the art.

Figure 5:
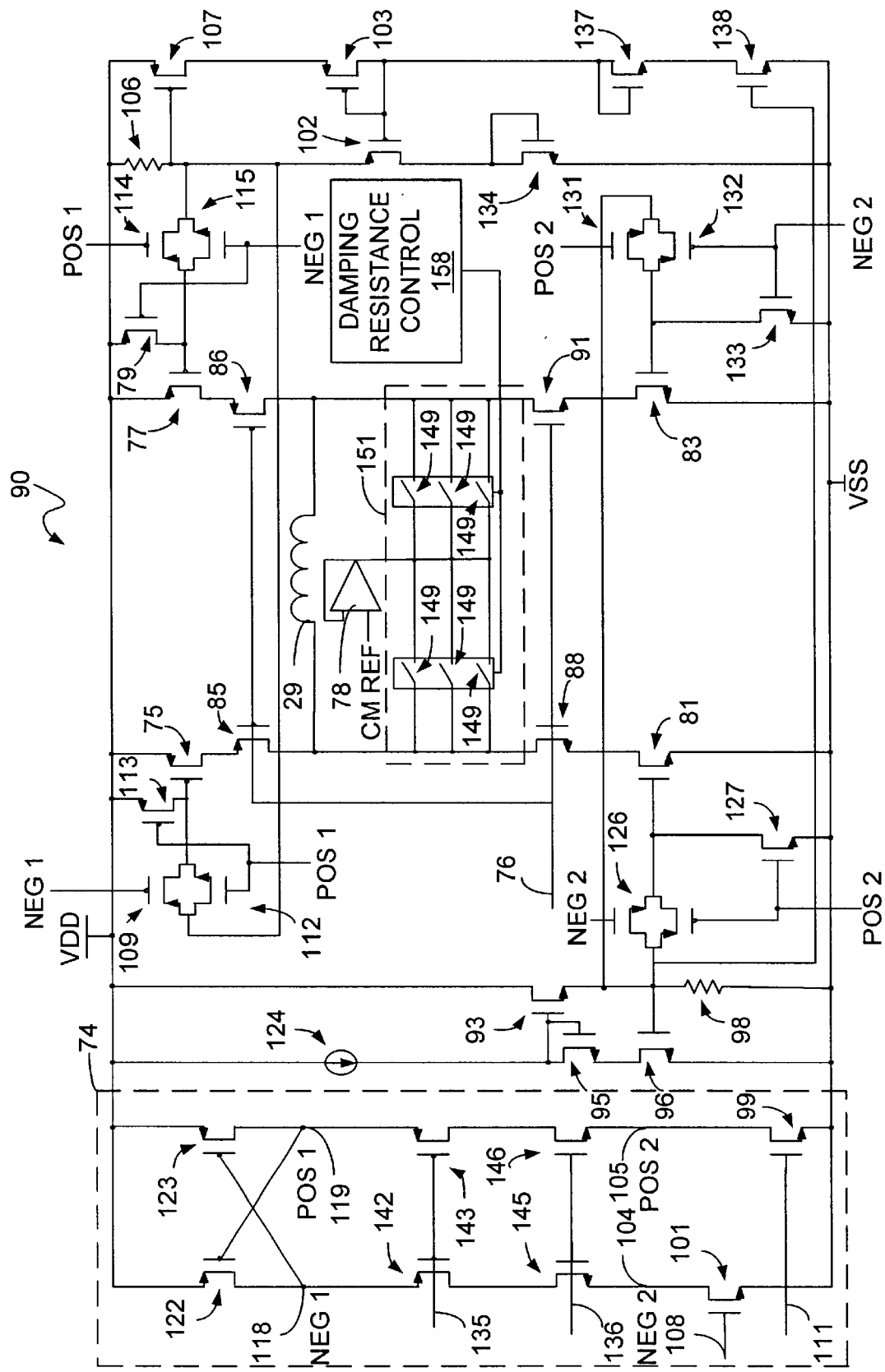
FIG. 5 is a schematic block diagram of the write driver circuit of the present invention in accordance with a fourth embodiment wherein a relatively high-power write driver circuit has been fabricated using the fabrication process normally used only for fabricating relatively low-power, e.g., 3.3-volt, write driver circuits.

FIG. 5 is a schematic block diagram of the write driver circuit 90 of the present invention in accordance with an alternative embodiment. In accordance with this embodiment, a relatively high-power write driver circuit 90 has been fabricated using the fabrication process normally used only for fabricating 3.3-volt write driver circuits. Preferably, the write driver circuit shown in FIG. 5 is a 5-volt write driver circuit that has been fabricated using the well known AMOS 14 fabrication process. The standards for 3.3-volt CMOS fabrication processes, including the AMOS 14 process, specify the terminal voltage limits, i.e, Vds, Vgs, Vgb, and Vgd. If this terminal voltage limit is exceeded, the transistors may fail and/or may no longer be reliable. In accordance with this embodiment of the present invention, transistors fabricated in accordance with the AMOS14 process are "stacked" in order to reduce the magnitude of the terminal voltage across any single transistor of the write driver circuit 90.

The write driver circuit 90 shown in FIG. 5 is similar to the write driver circuits shown in FIGS. 2–4, with the exception that certain transistors have been stacked so that the additional voltage created by using a 5-volt supply is dropped across multiple transistors, thereby reducing the magnitude of the terminal voltage drop across certain transistors of the write driver circuit 90. In the embodiment shown in FIG. 5, some of the transistors have their bodies tied to the 5-volt supply and some have their bodies tied to the 3.3-volt supply. A level shift circuit 74 is utilized to provide a 3.3-volt supply to the transistors that only need the 3.3-volt supply and to provide a 5-volt supply to the transistors that need the 5-volt supply in order to provide the write driver circuit 90 with the characteristics normally associated with high-power write driver circuits (i.e., faster write current rise times) while allowing the high power write driver circuit to be fabricated using a low-power (e.g., 3.3 volt) fabrication process. This feature of the present invention allows the write driver circuit 90 to be integrated in a preamplifier comprising 3.3-volt circuits, such as a 3.3-volt head read amplifier circuit (not shown), as will be understood by those skilled in the art.

Minimizing the voltage drop across each of the transistors connected to the 5-volt supply is important to avoid hot carrier effects and gate oxide breakdown. In accordance with 3.3 volt fabrication processes, such as, for example, AMOS 14, the gate-to-body voltage drop across the transistors must be limited to 3.6 volts in order to ensure reliability. In the write driver circuit shown in FIG. 2, transistors 25 and 32 (and transistors 43 and 44 if switched on to increase the common mode resistance) operate as triode switches, which resistively reference the write head inductive component 29 to VDD to establish the common mode output voltage. However, in the write driver circuit 90 shown in FIG. 5, transistors 75 and 77 are operated as switched current sources and the common mode output voltage is established in the conventional manner with an independent common mode amplifier 78.

It should be noted that a programmable common mode circuit component similar to the programmable common mode circuit component 30 shown in FIG. 2 could be used with the write driver circuit 90 shown in FIG. 5. However, because of the stacked transistors implemented in the write driver circuit 90 of FIG. 5, implementing the programmable common mode circuit component 30 in the write driver circuit 90 in a manner similar to that shown in FIG. 2 would require a more complicated write driver circuit design. Therefore, for ease of illustrating the stacked transistor arrangement of this embodiment of the present invention, an independent common mode amplifier 78 is shown in FIG. 5 for setting the common mode output voltage. However, it will be understood by those skilled in the art that this embodiment of the present invention is not limited to the design shown in FIG. 5 for setting the common mode output voltage.

During operation of the write driver circuit 90, the current is directed through the write head inductive component 29 by activating current sources 75 and 83 or by activating current sources 77 and 81. The N-channel current source transistors 81 and 88 are stacked, or, in other words, placed in series in a cascode arrangement. The Nchannel current source transistors 83 and 91 are also stacked in a cascode arrangement. Similarly, the P-channel current source transistors 75 and 85 and 77 and 86 are stacked in a cascode arrangement. Therefore, the voltage drop across any one of the transistors of the cascode arrangements is limited to 3.3 volts, plus or minus 10%. Therefore, by using the cascoded devices as the current sources, a relatively high-power write driver circuit is achieved while only a 3.3-volt MOS fabrication process is needed to fabricate the write driver circuit. Since the write current rise time is directly related to the supply voltage of the write driver circuit, which is 5 volts in accordance with this embodiment, a write driver circuit having faster rise times than 3.3-volt write driver circuits is obtained using only a 3.3-volt fabrication process. A reference voltage 76, which preferably is 2.5 volts, is applied to the gates of transistors 85, 86, 88 and 91 in order to limit the voltage drop that the cascodes will experience.

As with the write driver circuit 20 of FIG. 2, low impedance current mirrors, namely, an N-channel current mirror and a P-channel current mirror, are utilized to improve settling time and to decrease power requirements. The N-channel current mirror is comprised of transistors 93, 95 and 96 and resistor 98. The P-channel current mirror is comprised of transistors 102, 103 and 107 and resistor 106.

In order to switch the polarity of the current passing through the write head inductive component 29, two sets of control signals are utilized. Each set of control signals is generated in response to the states of the input signals 108 and 111. The first set of control signals, NEG1 and POS1, generated at nodes 118 and 119, respectively, is referenced to 5 volts and drives the gates of transistors 109, 112, 114 and 115. The second set of control signals, NEG2 and POS2, generated at points 104 and 105, respectively, is referenced to ground and drive transmission gates 126, 127, 131 and 132. The maximum voltage swing of these control signals is limited by the reference voltages on lines 135 and 136. Specifically, the maximum voltage swing of POS1 is limited to 5 volts by the reference voltage on line 135 and the maximum voltage swing of POS2 is limited to 3.3 volts by the reference voltage on line 136. Preferably, the reference voltage on line 135 is 1.5 volts dc and the reference voltage on line 136 is 3.5 volts dc. Although transistors 142, 143, 145 and 146 are used in conjunction with these reference voltages for limiting the voltage swings, simple resistive voltage dividers could be used as well for this purpose, as will be understood by those skilled in the art. Transistors 113 and 133 turn the current source 83 off and on. Similarly, transistors 79 and 127 turn the current source 81 off and on.

The write driver circuit 90 contains both a damping and a common mode circuit. The damping circuit preferably is substantially identical to that described above with respect to the write driver circuit 80 shown in FIG. 4. As stated above, the common mode circuit is different as a result of implementing the P-channel current sources 75 and 77. The common mode voltage is generated by amplifier 78, which drives the mid point of the damping resistors 149 of the programmable damping resistance circuit 151. However, it should be noted that a simple damping resistor of the type shown in FIG. 2 may be utilized instead to obtain the optimum write current rise time and overshoot. The programmable damping resistance circuit 151 is preferred in the write driver circuit 90 to allow the damping resistance to be programmably set and adjusted.

The operation and function of the damping resistance circuit 151 is essentially identical to that of the damping resistance circuit 70 shown in FIG. 4, with the exception that damping resistors 149 are disposed on each side of the nodes at which the amplifier 78 is connected to the programmable damping resistance circuit 151. The damping resistors 149 preferably are transistors operating in the triode region and are functionally represented as switches in FIG. 5. However, it will be understood by those skilled in the art that the damping resistors may also be simple resistors which are added to the circuit by turning on the appropriate switches to either cause current to pass through the resistors or to prevent current from passing through the resistors. The switches 149 may be any type of switch (e.g., diodes, transistors, etc.) and are activated or deactivated by the damping resistance control circuit 158.

It should be noted that the present invention has been described above with respect to the preferred embodiments and that the present invention is not limited to these embodiments. It will be understood by those skilled in the art that modifications may be made to the embodiments discussed above which are within the scope of the present invention.

What is claimed is:

1. A write driver circuit of a magnetic read/write system comprising:
   a first input terminal and a second input terminal for receiving a first write signal and a second write signal, respectively, wherein when the first write signal is high, the second write signal is low and wherein when the first write signal is low, the second write signal is high;
   a first transistor and a second transistor electrically coupled to each other and to the first and second input terminals, wherein when the first write signal is high and the second write signal is low, the first and second transistors are turned on;
   a third transistor and a fourth transistor electrically coupled to each other and to the first and second input terminals, wherein when the second write signal is high and the first write signal is low, the third and fourth transistors are turned on;
   an inductive element having a first terminal and a second terminal, the first terminal of the inductive element being coupled to the first and fourth transistors and the second terminal of the inductive element being coupled to the second and third transistors such that when the first write signal is high and the second write signal is low, current passes through the inductive element in a direction from the first terminal of the inductive element toward the second terminal of the inductive element, and wherein when the first write signal is low and the second write signal is high, current passes through the inductive element in a direction from the second terminal of the inductive element toward the first terminal of the inductive element;
   a damping resistor connected in parallel with the inductive element; and
   a variable common mode circuit component for allowing a common mode output voltage of the write driver circuit to be varied and to be set to a preselected value.

2. The write driver circuit of claim 1, wherein the first and third transistors are PMOS transistors operating in a triode region such that the first and third transistors function as resistors.

3. The write driver circuit of claim 2, wherein the second and fourth transistors are NMOS transistors operating as current sources.

4. The write driver circuit of claim 3, wherein the variable common mode circuit component comprises a fifth transistor electrically coupled in parallel with the first transistor via first switching logic and a sixth transistor electrically coupled in parallel with the third transistor via the first switching logic, the fifth and sixth transistors operating in the triode region such that they function as resistors, wherein the fifth and sixth transistors can be turned on and off by the first switching logic to vary the resistance of the common mode circuit component whereby the common mode output voltage of the write driver circuit is varied.

5. The write driver circuit of claim 4, wherein the write driver circuit is a 3.3-volt write driver circuit supplied by a 3.3-volt dc supply source.

6. The write driver circuit of claim 5, wherein the variable common mode circuit component is programmable to enable the resistance of the common mode circuit component to be programmably varied.

7. A write driver circuit of a magnetic read/write system comprising:
   a first input terminal and a second input terminal for receiving a first write signal and a second write signal, respectively, wherein when the first write signal is high, the second write signal is low and wherein when the first write signal is low, the second write signal is high;
   a first transistor and a second transistor electrically coupled to each other and to the first and second input terminals, wherein when the first write signal is high and the second write signal is low, the first and second transistors are turned on;
   a third transistor and a fourth transistor electrically coupled to each other and to the first and second input terminals, wherein when the second write signal is high and the first write signal is low, the third and fourth transistors are turned on;
   an inductive element having a first terminal and a second terminal, the first terminal of the inductive element being coupled to the first and fourth transistors and the second terminal of the inductive element being coupled to the second and third transistors such that when the first write signal is high and the second write signal is low, current passes through the inductive element in a direction from the first terminal of the inductive element toward the second terminal of the inductive element, and wherein when the first write signal is low and the second write signal is high, current passes through the inductive element in a direction from the second terminal of the inductive element toward the first terminal of the inductive element; and
   a variable damping resistance circuit component connected in parallel with the inductive element for enabling the damping resistance of the write driver circuit to be varied in order to optimize write current overshoot and rise time.

8. The write driver circuit of claim 7, wherein the first and third transistors are PMOS transistors operating in a triode region such that the first and third transistors function as resistors.

9. The write driver circuit of claim 8, wherein the second and fourth transistors are NMOS transistors operating as current sources.

10. The write driver circuit of claim 9, wherein the variable damping resistance circuit component comprises a plurality of transistors coupled via second switching logic in parallel with each other, and wherein the damping resistance can be varied by switching the transistors of the variable damping resistance circuit on and off whereby the write current rise time and overshoot is varied.

11. The write driver circuit of claim 10, wherein the variable damping resistance circuit component is programmable to enable the damping resistance to be programmably varied.

12. A write driver circuit of a magnetic read/write system comprising:

a first input terminal and a second input terminal for receiving a first write signal and a second write signal, respectively, wherein when the first write signal is high, the second write signal is low and wherein when the first write signal is low, the second write signal is high;

a first transistor and a second transistor electrically coupled to each other and to the first and second input terminals, wherein when the first write signal is high and the second write signal is low, the first and second transistors are turned on;

a third transistor and a fourth transistor electrically coupled to each other and to the first and second input terminals, wherein when the second write signal is high and the first write signal is low, the third and fourth transistors are turned on;

an inductive element having a first terminal and a second terminal, the first terminal of the inductive element being coupled to the first and fourth transistors and the second terminal of the inductive element being coupled to the second and third transistors such that when the first write signal is high and the second write signal is low, current passes through the inductive element in a direction from the first terminal of the inductive element toward the second terminal of the inductive element, and wherein when the first write signal is low and the second write signal is high, current passes through the inductive element in a direction from the second terminal of the inductive element toward the first terminal of the inductive element;

a variable damping resistance circuit component connected in parallel with the inductive element for enabling the damping resistance of the write driver circuit to be varied in order to optimize write current overshoot and rise time; and a variable common mode circuit component for allowing a common mode output voltage of the write driver circuit to be varied and to be set to a preselected value.

13. The write driver circuit of claim 12, wherein the first and third transistors are PMOS transistors operating in a triode region such that the first and third transistors function as resistors.

14. The write driver circuit of claim 13, wherein the second and fourth transistors are NMOS transistors operating as current sources.

15. The write driver circuit of claim 14, wherein the variable damping resistance circuit component comprises a plurality of transistors coupled via second switching logic in parallel with each other, and wherein the damping resistance can be varied by switching the transistors of the variable damping resistance circuit on and off whereby the write current rise time and overshoot is varied.

16. The write driver circuit of claim 15, wherein the variable damping resistance circuit component is programmable to enable the damping resistance to be programmably varied.

17. The write driver circuit of claim 14, wherein the variable common mode circuit component comprises a fifth transistor electrically coupled in parallel with the first transistor via first switching logic and a sixth transistor electrically coupled in parallel with the third transistor via the first switching logic, the fifth and sixth transistors operating in the triode region such that they function as resistors, wherein the fifth and sixth transistors can be turned on and off by the first switching logic to vary the resistance of the common mode circuit component whereby the common mode output voltage of the write driver circuit is varied.

18. The write driver circuit of claim 17, wherein the write driver circuit is a 3.3-volt write driver circuit supplied by a 3.3-volt dc supply source.

19. The write driver circuit of claim 18, wherein the variable common mode circuit component is programmable to enable the resistance of the common mode circuit component to be programmably varied.

20. A write driver circuit of a magnetic read/write system comprising:

a first input terminal and a second input terminal for receiving a first write signal and a second write signal, respectively;

a first current source comprising a first transistor connected in series with a second transistor to form a first cascode configuration, the first current source being electrically coupled to the first and second input terminals such that when the first write signal is high and the second write signal is low, the first current source is activated;

a second current source comprising a third transistor connected in series with a fourth transistor to form a second cascode configuration, the second current source being electrically coupled to the first and second input terminals such that when the first write signal is high and the second write signal is low, the second current source is activated;

a third current source comprising a fifth transistor connected in series with a sixth transistor to form a third cascode configuration, the third current source being electrically coupled to the first and second input terminals such that when the first write signal is low and the second write signal is high, the third current source is activated;

a fourth current source comprising a seventh transistor connected in series with an eighth transistor to form a fourth cascode configuration, the fourth current source being electrically coupled to the first and second input terminals such that when the first write signal is low and the second write signal is high, the fourth current source is activated; and an inductive element having a first terminal and a second terminal, the first terminal of the inductive element being connected to the first and fourth current sources, the second terminal of the inductive element being connected to the second and third current sources, wherein when the first write signal is high and the second write signal is low, the first and second current sources cause current to flow through the inductive element in a direction from the first terminal of the inductive element toward the second terminal of the inductive element, wherein when the first write signal is low and the second write signal is high, the third and fourth current sources cause current to flow through the inductive element in a direction from the second terminal of the inductive element toward the first terminal of the inductive element.

21. The write driver circuit of claim 20, wherein the write driver circuit is a 5-volt write driver circuit fabricated using a 3.3-volt CMOS process, wherein the voltage drop across any transistor of the cascode configurations does not exceed approximately 3.6 volts.

22. The write driver circuit of claim 21 further comprising a variable damping resistance circuit connected in parallel with the inductive element for varying a damping resistance of the write driver circuit.

23. The write driver circuit of claim 22 further comprising a level shift circuit which, in response to the first and second write signals, generates a 3.3-volt supply for certain portions of the write driver circuit not comprised by the cascode configurations and a 5-volt supply for each of the cascode configurations, wherein each cascode configuration has a maximum voltage drop of approximately 5 volts across it to thereby limit the maximum voltage drop across any transistor of the cascode configurations to approximately 3.6 volts.

* * * * *